United States Patent [19]
Fletcher

[11] Patent Number: 5,711,628
[45] Date of Patent: Jan. 27, 1998

[54] EXPANSION CLAMP

[75] Inventor: Leroy S. Fletcher, College Station, Tex.

[73] Assignee: Texas A & M University System, College Station, Tex.

[21] Appl. No.: 663,783

[22] Filed: Jun. 14, 1996

[51] Int. Cl.$^6$ ............................................. F16B 2/02
[52] U.S. Cl. ...................... 403/5; 403/31; 403/374; 439/197
[58] Field of Search .................. 403/5, 31, 409.1, 403/373, 374, 24, 410, 80; 439/197; 361/801, 802, 756, 759, 740, 741

[56] References Cited

U.S. PATENT DOCUMENTS

| | | | |
|---|---|---|---|
| 2,956,258 | 10/1960 | Raddin | 439/197 |
| 2,978,666 | 4/1961 | McGregor | 439/197 |
| 2,989,328 | 6/1961 | Nitchie | 403/5 |
| 3,366,916 | 1/1968 | Oktay | 439/197 |
| 4,220,389 | 9/1980 | Schell | 439/197 |
| 4,958,953 | 9/1990 | Charondiere | 403/5 X |
| 4,968,265 | 11/1990 | Fox, Jr. | 439/197 |
| 5,040,051 | 8/1991 | Thiel | 257/714 |
| 5,102,343 | 4/1992 | Knight et al. | 439/197 X |
| 5,181,853 | 1/1993 | Van Brunt, Jr. et al. | 439/197 X |
| 5,197,890 | 3/1993 | Seymour | 439/197 X |

FOREIGN PATENT DOCUMENTS

| | | | |
|---|---|---|---|
| 2495390 | 6/1982 | France | 439/197 |
| 3621064 | 1/1988 | Germany | 439/197 |
| 3736732 | 11/1988 | Germany | 439/197 |

OTHER PUBLICATIONS

IBM Technical Disclosure Bulletin, Transmission Line Connector, D.E. Stuckert, Sep. 1965, vol. 8, No. 4, pp. 518–519.

*Journal of Heat Transfer*, "Recent Developments in Contact Conductance Heat Transfer", vol. 110, No. 4–B, 1059–1070 (Nov. 1988), Flecther, L.S.

*IEEE Transactions on Components, Hybrids, and Manufacturing Technology*, "A Review of Thermal Enhancement Techniques for Electronic Systems", vol. 13, No. 4, 1012–1021 (Dec. 1990), Fletcher, L.S.

*Primary Examiner*—Harry C. Kim
*Attorney, Agent, or Firm*—Vaden, Eickenroht & Thompson, L.L.P.

[57] ABSTRACT

An expandable clamp of the type that is used within a channel to compress a planar member within that channel against a wall of that channel. The clamp has an expandable bladder of an elongated cylindrical shape and a valve for introducing a gas or a liquid into the bladder for expanding it. Alternatively, the clamp may be manufactured with a closed bladder that is partially filled with a fluid. This closed bladder may be expanded by increasing the pressure on the fluid such as by compressing the fluid with a piston. The clamp is particularly suited for use in Standard Electronic Modules for providing more uniform contact between the frame of the electronic module and the card chassis of the instrumentation.

21 Claims, 2 Drawing Sheets

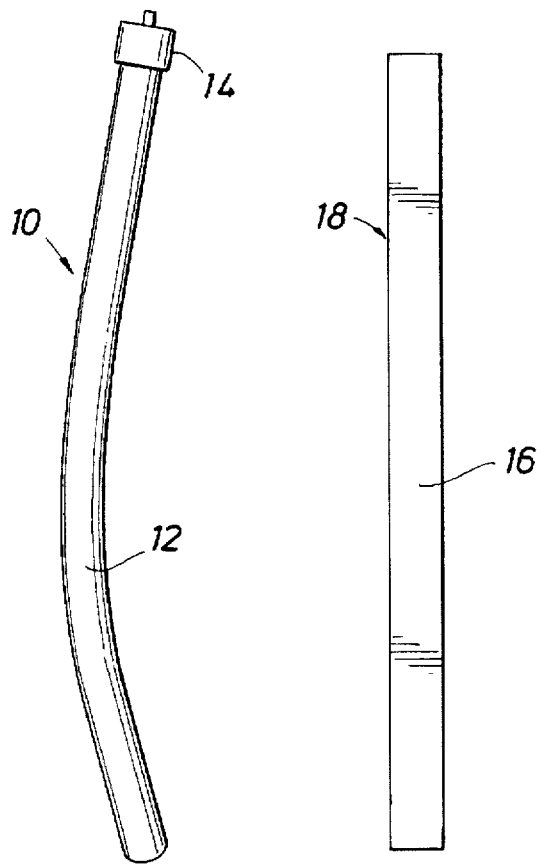
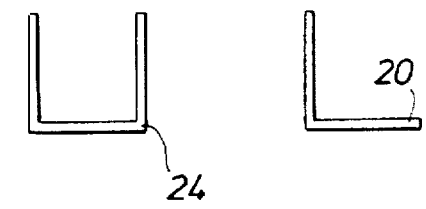
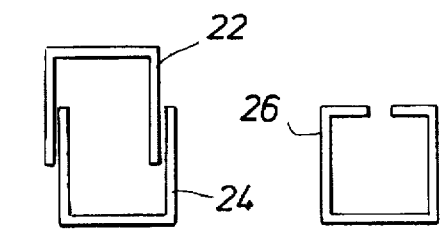
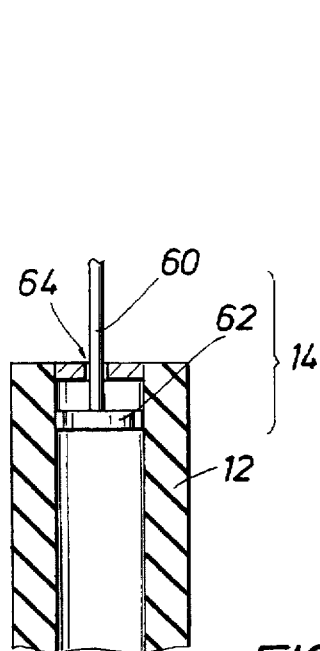
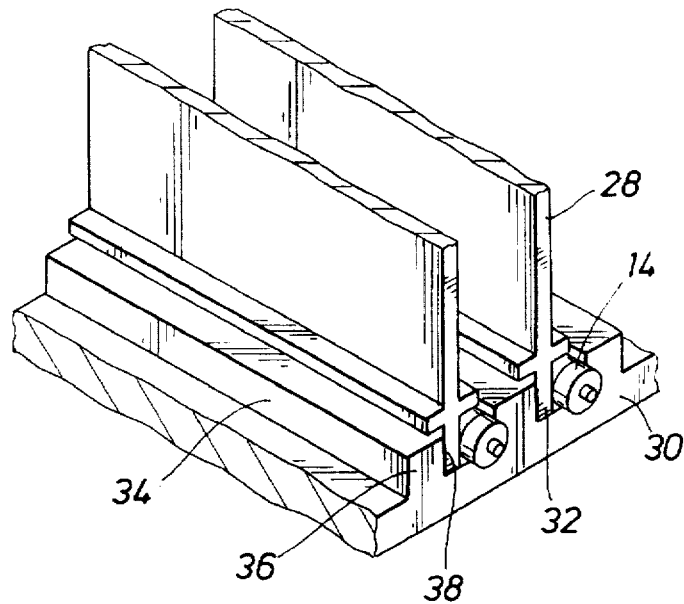
FIG.3a  FIG.3b  FIG.4a  FIG.4b  FIG.4c  FIG.4d  FIG.3c  FIG.5

EXPANSION CLAMP

BACKGROUND OF THE INVENTION

1. Field of the Invention

This invention pertains to elongated expansion clamps that are placed within a channel or a similar structure having a "U" shaped cross section, and that are designed to provide a normal force relative to the walls of the channel. These clamps operate by compressing the structure to be clamped between the expanded clamp and one of the fixed walls of the channel. A typical application for these types of clamps is in modularized electronic systems. Presently, large scale computer architecture often utilizes modular components at the system level to facilitate assembly, maintenance, adaptability and expansion. More specifically, the Standard Electronic Module (SEM) is widely incorporated in military electronics for navigation, sensing, guidance, and communications for surface vessels, submarines and aircraft.

2. Description of the Prior Art

Typically, the expansion clamps that are known in the prior art are mechanical wedge-type clamps. This type of clamp has segmented pieces that have angled surfaces between one another and are arranged along a shaft that runs the length of the clamp. When this shaft is rotated, the end pieces are drawn toward one another causing the intermediate pieces to slide outwardly away from the shaft so as to provide the clamping force perpendicular to the shaft. In the context of the SEM, a wedge clamp is used to press the guide rib of the SEM frame against the card rail of the chassis.

The demand for electronic systems with greater capabilities and speed has resulted in the miniaturization of individual components. This solution however creates greater power density within the system and thus a greater need to transfer heat away from those components. In the case of the SEMs, the electronic components are mounted on various standard sized frames, which are then installed on a slidably mounted chassis. While the chassis is often liquid cooled to facilitate the dissipation of heat, the heat is generated by the electrical components on the SEM frame. Therefore, unless there is efficient thermal conductance across the junction between the chassis and the SEM frame, the temperature of the SEM frame and that of its electrical components can rise to levels that may cause overheating, reduce component performance and increase possibility of thermally induced failure. Further, the limited amount of heat that may be dissipated across a given junction places additional design limitations on the ultimate size of the SEM frame and on the number and types of components that can be designed into that frame.

Thermal conductance across any junction has been found to depend on a number of factors including the mechanical and thermophysical properties of the materials on either side of the junction, the contact pressure between those materials, the temperature, the characteristics of their contacting surfaces and other mechanics of that contact. Improved thermal conductance can be obtained by making the contact pressure between the materials more uniform, thereby minimizing or eliminating macroscopic gaps between the materials; applying softer, more thermally conductive coatings or interstitial materials; increasing the apparent contact pressure between the two materials; and increasing the areas of the two materials which are in actual contact.

Since the SEM frame and chassis are standardized, particularly with respect to military applications, many of these variables affecting thermal conductance cannot be changed. That is, materials, their heat treatment and coatings are specified. For instance, according to Naval specification, the aluminum materials of both the SEM frame and chassis are required to be anodized in order to enhance their corrosion resistance. The anodized coatings are hard thermal insulators such that other means of improving thermal conductance must be explored.

A further problem that is inherent to the mechanical wedge clamps of the prior art is that they fail to provide a uniform pressure along the contact surfaces between the guide rib and the card rail of an SEM. In fact, experimentation with pressure films indicates that although significant apparent pressures can be achieved using these clamps, the actual contact pressure is localized near the ends of the clamps and at the junctions between the clamp segments. Thus, under a high clamp pressure, the guide rib of the SEM frame may bend away from the card rail, making actual contact only near or approximately where the wedge clamp segments contact the guide rib, and leaving macroscopic gaps at other locations along the interface between the guide rib and the card rail.

There is a distinction between the apparent contact area between materials and the actual or true contact area between the materials. Although the surfaces of the materials may appear to be smooth and flat on a macroscopic level, at the microscopic level where actual contact occurs, there is only a small percentage of actual contact between the surfaces. This actual contact area has been estimated to be between 3 and 5% of the apparent contact area between the two materials. It is this small area of actual contact which limits heat transfer across the junction between materials and which allows for the improvement of thermal conductance across the junction when that contact area can be increased.

In addition, as a compressive force pressing the two materials together increases, the surface asperities on the two surfaces will begin to deform elastically and plastically causing additional asperities to come into contact with one another. Therefore, not only will a more uniform distribution of a compression force increase the actual contact area, but an increase in the magnitude of that compressive force will likewise increase the actual contact area between the materials and improve thermal conductance.

Therefore, it is a feature of this invention to provide an improved expansion clamp that comprises an elastic elongated tube which may be permanently sealed at one end and have a valve for controlling the flow of gas into and out of the tube on the other end. Alternatively, the clamp of this invention can be expanded by the introduction of a liquid into the tube. Upon expansion of the tube, a clamping force is achieved that is perpendicular to the longitudinal axis of the clamp and that has a uniform distribution over the length of the clamp.

It is a further feature of the present invention that the elastic elongated tube can be partially filled with a gas or liquid and be permanently sealed at both ends, the clamp having means for controlling the pressure on the fluid within the tube. The clamp can be expanded and a uniform clamping force can be achieved by increasing the pressure on the fluid within the tube, such as by actuating a piston mechanism.

It is a further feature of the present invention to provide an expansion clamp of the type described above that is provided with a rigid jacket which partially encloses the clamp and can move with the clamp.

It is a further feature of the present invention to provide an expansion clamp of the type described above that will provide a uniform clamping force that results in a more uniform pressure distribution along the junction between the two surfaces.

It is a further feature of the present invention to provide an expansion clamp of the type described above that will eliminate the macroscopic gaps that occur along the junction between two surfaces such as are associated with the use of mechanical wedge clamps. Through the elimination of such gaps, the actual contact surface across the junction is enhanced, the thermal conductance improved, and the temperature difference across the junction is decreased.

It is a still yet another object of the present invention to provide an expansion clamp of the type described above that can provide a greater actual pressure along the junction between two surfaces than is otherwise achievable without risk of mechanical failure of known wedge clamps. The greater actual pressure increases the true area of contact across the junction, thus improving the thermal conductance across the junction.

BRIEF DESCRIPTION OF THE DRAWINGS

So that the manner in which the above recited features, advantages and objects of the invention, as well as others which will become apparent, are attained and can be understood in detail, more particular description of the invention briefly summarized above may be had by reference to the exemplary preferred embodiments thereof that are illustrated in the appended drawings, which form a part of this specification. It is to be noted, however, that the drawings illustrate only typical preferred embodiments of the invention and are therefore not to be considered limiting of its scope as the invention may admit to other equally effective embodiments.

In the Drawings:

FIG. 3a is a top view of an expandable clamp of this invention.

FIG. 3b is a side view of a jacket into which the clamp of this invention as shown in FIG. 3a may be inserted prior to expansion between the card rails of the chassis.

FIG. 3c is a cross sectional view of pressure controlling means of a clamp of this invention.

FIG. 4 shows several cross sectional views of various configurations of the jacket in FIG. 3b.

FIG. 5 is a perspective view of a pair of clamps of this invention installed and clamping a pair of Standard Electronic Modules in place against the card rails of the chassis.

DETAILED DESCRIPTION OF THE INVENTION

The clamps in the prior art and those of the present invention are described below in the context of their use in connection with Standard Electronic Modules (SEMs). However, the use of the clamps of this invention are not limited to applications in SEMs but can be utilized in any application where an elongated expansion clamp is need for providing a normal force between two fixed structures or within a channel. Further, due to the inherent flexibility of the expandable elastic tube in the clamp of this invention, the clamp of the present invention should not be considered to be limited to applications where a straight clamp is required.

Figure 1:
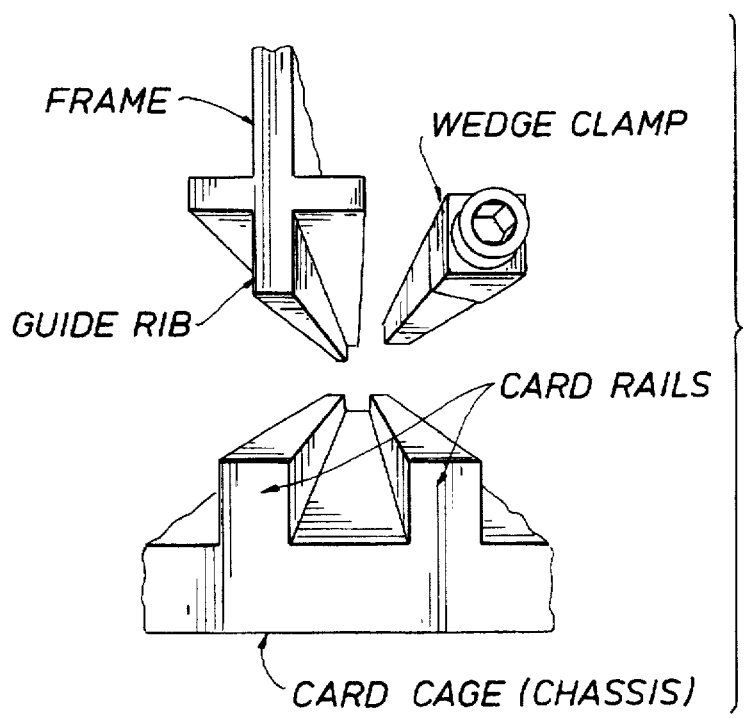
FIG. 1 is an end on view of the guide rib a Standard Electronic Module frame, a portion of the chassis to which the Standard Electronic Module is clamped and a three piece mechanical wedge clamp as is known in the prior art.

As was discussed above, the prior art concerning elongated expansion clamps has focused on the use of segmented mechanical wedge clamps. As shown in FIG. 1, these clamps are inserted into a channel which is formed between the card rails on a card chassis. The frame of the SEM is provided with a guide rib which is inserted into this channel. As shown in FIG. 1, the SEM frame may also be provided with perpendicular extensions on either side of the frame adjacent the guide rib, although frames are commonly manufactured without these extensions.

To install the SEM, the chassis may be mounted on a sliding or rolling mechanism so that it may be slid out of an instrument cabinet containing multiple separate chassis. Typically, a wedge clamp will be affixed in each channel between the card rails of the chassis. The guide rib of the SEM frame is then slid into the channel adjacent the wedge clamp, and the wedge clamp expanded compressing the guide rib against the surface of the card rail.

Figure 2A:
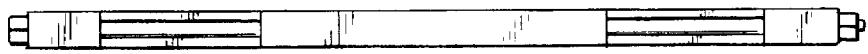
FIG. 2a is a bottom view of a five piece mechanical wedge clamp as is known in the prior art.
Figure 2B:
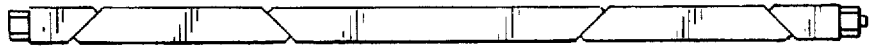
FIGS. 2b and 2c are side views of five piece mechanical wedge clamp of FIG. 2a, shown in relaxed and expanded positions respectively.
Figure 2C:

Several views of a five-segment wedge clamp are provided at FIGS. 2a, 2b and 2c. The wedge clamp in its relaxed condition is shown at FIG. 2b while the same type of clamp is shown in an expanded state in FIG. 2c. As is described above, the clamp is expanded by rotating the threaded shaft of the clamp so that the end segments are drawn together displacing the intermediate segment(s) outwardly. The non-uniform nature of the compression force that is obtained from such a clamp can be predicted from inspection of the structure in its expanded condition.

FIG. 3a is a top view of a clamp of this invention, the representation serving to emphasize the simplicity of the structure. The clamp is referred to generally at reference number 10 and is provided with a fluid impervious bladder 12 and a means for controlling the flow of a fluid into or out of the bladder, represented generally at 14. Note that conventional pneumatic valves such as are used on bicycle and automobile tires are appropriate for use as the flow control means 14. It is further anticipated that septum-type pneumatic valves such as those that are commonly used to control pressure in basketballs, soccer balls and footballs are likewise appropriate for use in clamp 10. Bladder 12 may be manufactured from most any elastic material, but is preferably a commercially available polymeric tubing that will minimize gas loss through the tubing material. It is further anticipated that bladder 12 can be manufactured from a thermally conductive material so as to enhance thermal conduction from the SEM frame to the chassis.

As is shown in FIG. 5, the installation and use of clamp 10 will only be slightly modified to that of the mechanical wedge clamps described above. The guide rib 32 of the SEM frame 28 is insertable into the channel between the card rails 36. Where the flow control means 14 is a septum-type valve, a needle attached to a source of compressed gas can be inserted through the flow control means and a prescribed amount of gas is introduced into the bladder. The expanding bladder then exerts a force perpendicular to the card rails 36 that compresses the guide rib 32 against the inner surface 38 of the card rail. The perpendicular force along the length of the clamp is relatively uniform and results in a uniform contact pressure between the surfaces of the card rail and the guide rib.

Alternatively, it is anticipated that bladder 12 can be expanded by filling the bladder with a liquid rather than a gas. Where the fluid expanding the bladder is a liquid, the choice of flow control means 14 is a conventional valve that simplifies the introduction and removal of liquid from the bladder. Otherwise, the structure and operation of the bladder is identical to that where clamp 10 is inflated with a gas.

Clamp 10 can alternatively comprise sealed bladder 12 and pressure control means 14. In this embodiment, the bladder is partially filled with a fluid, either gas or liquid, and sealed on both ends during manufacture. Again, clamp 10 is preferably attached to the chassis during assembly of the chassis. After insertion of SEM frame 28, pressure control means 14 is actuated to increase the pressure on the fluid causing it to travel toward the periphery of the bladder. Pressure control means is preferably a piston mechanism that can be used to compress the fluid within the bladder, thereby producing the desired increase in pressure on the fluid.

As shown in FIG. 3c, pressure control means 14 comprises a piston 62 attached to piston arm 60. Arm 60 is provided with threads and passes through a threaded opening 64 in the sealed end of bladder 12. By rotating arm 60, the piston is extended into the tube to compress the fluid within the bladder. Piston 62 and opening 64 are designed so as to prevent any loss of fluid from the bladder. Alternatively, it is anticipated that bladder 12 may be configured so that a similar piston mechanism may be arranged to act on the external surface of the bladder, thereby increasing the pressure on the fluid within the bladder by compressing the bladder in on the fluid.

FIG. 3b represents a side view of a rigid jacket 16 that can be used in connection with clamp 10. The rigid jacket partially encloses the clamp and is designed to move with the expanding clamp and to provide additional structure between the clamp and the guide rib in order to insure that the compression force of the clamp is uniform. Jacket 16 is further provided with at least one end 18 that is open to allow access to the flow means, or alternatively, the pressure control means 14.

FIG. 4 presents a number of cross sectional views of the various configurations that jacket 16 may assume. As shown, the jacket may be provided so as to have a "U" shaped cross section 24, an "L" shaped configuration 20, or a largely enveloping structure 26. In addition, one or more these configurations can be combined in order to give the clamp a rigid jacket that will expand with the expansion of the clamp. The determination of whether a jacket is needed and the configuration of that jacket will be determined from the particular application.

While it is anticipated that jacket 16 is manufactured from thermally conductive materials such as metals, it should be recognized that the purpose of the jacket is more structural in nature and that most any lightweight rigid material is appropriate. The term "rigid" as used with respect to the jacket of this invention is intended to represent a range of materials from those which are inflexible to those which are yielding and deformable. Preferred materials of the bladder include various plastics, composite materials such as graphite carbon fiber materials and thin metals.

Further additional optional embodiments can be chosen by using different materials in the manufacture of bladder 12 and jacket 16 as well as different means 14 for controlling the flow of a fluid into the bladder or, alternatively, different means for controlling the pressure of a fluid within the bladder. However, the general principles of operation are applicable as discussed above even though the combination available is more complex. Thus, while several embodiments have been discussed and other embodiments have been generally described, it is understood that the invention is not limited thereto, since many modifications may be made and will become apparent to those skilled in the art.

What is claimed is:

1. An expansion clamp in combination with a channel, the clamp for providing substantially uniform surface contact between a planar member inserted into the channel and one of the walls of the channel, the member and the channel wall having complementary surfaces, the combination comprising:

a fluid impervious expandable bladder having an elongated cylindrical structure, said bladder being disposed within the channel;

means for controlling a flow of fluid into or out of the expandable bladder;

an elongated jacket for at least partially enclosing the expandable bladder, said jacket having at least one open end for allowing access to said flow controlling means; and wherein said jacket moves in response to the expansion of the expandable bladder to provide compression force against the planar member and thus provide the uniform surface contact between the planar member and the wall of the channel.

2. The combination of claim 1, wherein the bladder is composed of an elastic polymeric material.

3. The combination of claim 1, wherein the bladder is composed of a thermally conductive material.

4. The combination of claim 1, wherein the bladder is inflated with a gas.

5. The combination of claim 1, wherein the bladder is expanded with a liquid.

6. The combination of claim 1, wherein the means for controlling the flow of the fluid is a valve.

7. The combination of claim 1, wherein the jacket is composed of a rigid material.

8. The combination of claim 7, wherein the rigid material of the jacket is yielding and deformable.

9. The combination of claim 1, wherein the jacket is made of a thermally conductive material.

10. An expansion clamp in combination with a channel, the clamp for providing substantially uniform surface contact between a planar member inserted into the channel and one of the walls of the channel, the member and the channel wall having complementary surfaces, the combination comprising:

a fluid impervious expandable bladder having an elongated cylindrical structure and being at least partially filled with a fluid, said bladder being disposed within the channel;

means for controlling a pressure of the fluid within the expandable bladder;

an elongated jacket for at least partially enclosing the expandable bladder, said jacket having at least one open end for allowing access to said pressure controlling means; and wherein said jacket moves in response to the expansion of the expandable bladder to provide compression force against the planar member and thus provide the uniform surface contact between the planar member and the wall of the channel.

11. The combination of claim 10, wherein the bladder is composed of an elastic polymeric material.

12. The combination of claim 10, wherein the bladder is composed of a thermally conductive material.

13. The combination of claim 10, wherein the fluid is a liquid.

14. The combination of claim 10, wherein the fluid is a gas.

15. The combination of claim 10, wherein the means for controlling the pressure of the fluid is a piston which is extensible into the expandable bladder for compressing the fluid within the bladder.

16. The combination of claim 10, wherein the jacket is composed of a rigid material.

17. The combination of claim 16, wherein the rigid material of the jacket is yielding and deformable.

18. The combination of claim 10, wherein the jacket is made of a thermally conductive material.

19. A method of reducing thermal resistance across a gap between two substantially planar surfaces in a channel by improving the surface contact between the two surfaces, the first planar surface being one of the walls of the channel and the second planar surface being of a planar member inserted into the channel, the method comprising the steps of:

inserting a fluid impervious expandable bladder having an elongated cylindrical structure into the channel, providing an elongated jacket for at least partially enclosing the bladder, said jacket capable of expanding with the expanding bladder;

radially expanding said bladder so that the bladder jacket compresses the inserted planar member against the wall of the channel.

20. The method of claim 19 wherein the bladder is expanded by causing a flow of fluid into the bladder, said fluid being either a liquid or a gas.

21. The method of claim 19, wherein the bladder is expanded by increasing the pressure on a fluid in the bladder.

\* \* \* \* \*